United States Patent
Wang et al.

(10) Patent No.: US 8,273,631 B2
(45) Date of Patent: Sep. 25, 2012

(54) METHOD OF FABRICATING N-CHANNEL METAL-OXIDE SEMICONDUCTOR TRANSISTOR

(75) Inventors: I-Chang Wang, Tainan (TW); Ling-Chun Chou, Yunlin County (TW); Ming-Tsung Chen, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 423 days.

(21) Appl. No.: 12/636,788

(22) Filed: Dec. 14, 2009

(65) Prior Publication Data

US 2011/0143511 A1  Jun. 16, 2011

(51) Int. Cl.
*H01L 21/336* (2006.01)
(52) U.S. Cl. ........ 438/303; 438/305; 438/307; 438/682; 257/766; 257/E29.116; 257/E21.619; 257/E21.438
(58) Field of Classification Search .................. 438/300, 438/303, 305, 306, 307, 682; 257/766, E29.116, 257/E21.619, E21.43, E21.438
See application file for complete search history.

(56) References Cited

U.S. PATENT DOCUMENTS

| | | | |
|---|---|---|---|
| 6,235,568 B1 * | 5/2001 | Murthy et al. | 438/231 |
| 6,238,958 B1 | 5/2001 | Hsu | |
| 6,531,396 B1 * | 3/2003 | Chi et al. | 438/682 |
| 6,812,086 B2 * | 11/2004 | Murthy et al. | 438/231 |
| 7,081,655 B2 * | 7/2006 | Maszara | 257/377 |
| 7,112,495 B2 * | 9/2006 | Ko et al. | 438/300 |
| 7,220,648 B2 * | 5/2007 | Kim | 438/300 |
| 7,238,580 B2 * | 7/2007 | Orlowski et al. | 438/300 |
| 7,288,822 B1 | 10/2007 | Ting | |
| 7,329,582 B1 * | 2/2008 | Pan et al. | 438/300 |
| 7,390,707 B2 * | 6/2008 | Kawamura et al. | 438/197 |
| 7,553,732 B1 * | 6/2009 | Brown et al. | 438/300 |
| 7,579,249 B2 * | 8/2009 | Kim et al. | 438/300 |
| 2006/0073663 A1 * | 4/2006 | Iinuma | 438/300 |
| 2008/0157091 A1 * | 7/2008 | Shin et al. | 257/66 |
| 2011/0143511 A1 * | 6/2011 | Wang et al. | 438/303 |

* cited by examiner

*Primary Examiner* — Mary Wilczewski
(74) *Attorney, Agent, or Firm* — Winston Hsu; Scott Margo

(57) ABSTRACT

A method of fabricating an NMOS transistor, in which, an epitaxial silicon layer is formed before a salicide process is performed, then a nickel layer needed for the salicide process is formed, and, thereafter, a rapid thermal process is performed to allow the nickel layer to react with the epitaxial silicon layer and the silicon substrate under the epitaxial silicon layer to form a nickel silicide layer.

11 Claims, 6 Drawing Sheets

METHOD OF FABRICATING N-CHANNEL METAL-OXIDE SEMICONDUCTOR TRANSISTOR

BACKGROUND OF THE INVENTION

1. Field of the Invention

The present invention relates to a method of fabricating a semiconductor device, and particularly relates to a method of fabricating an n-channel metal-oxide-semiconductor (NMOS) transistor which may avoid nickel silicide piping phenomenon and etching through.

2. Description of the Prior Art

In a conventional MOS transistor manufacturing process, during formation of source/drain regions, dopants are sent into a substrate in high speed by implantation process using a gate structure and a spacer as a mask. The crystal lattice of the substrate tends to be damaged from such high speed impact and an annealing process is usually needed to recover the damaged lattice after the implantation. However, during the recovery of the lattice, dislocation easily takes place, especially in a heavily doped region, such as the place of the substrate downward from the edge of the mask (i.e. spacer) in a depth of 200 to 300 angstrom from the surface of the substrate, due to stress. The dislocation usually occurs in an NMOS process, because n-type dopants, such as arsenic, used in the NMOS process have a larger atomic size than p-type dopants, such as boron, used in PMOS process and easily damage the silicon lattice.

Furthermore, in conventional MOS transistor processes, a metal silicide is often formed over the surface of the gate structure and the source/drain region to benefit the formation of contact plugs to reduce sheet resistance. Currently, the process known as self-aligned silicide (salicide) process has been widely utilized to fabricate silicide materials, in which a metal layer is subject to a rapid thermal process to allow the metal atoms to diffuse into the silicon substrate for reaction with the silicon in the source/drain region. Thus, if a dislocation as aforesaid exists in the substrate lattice, it is easily to cause piping phenomenon, and, that is, the metal atoms easily react with silicon along the dislocation. As a result, the distance between the p-n junction of the source/drain and the silicon substrate and the metal silicide layer will be overly short, and it is much worse that the metal silicide often comes in contact directly with the substrate to result in failure of the device. As the schematic diagram shown in FIG. 1, a gate 12, a spacer 14 and source/drain regions 16 and 18 are disposed on a silicon substrate 10. Dislocations 20 and 22 exist in the silicon substrate 10. Thus, if a nickel silicide layer 24 having a conventional thickness is formed on the source/drain region 16, a piping effect will occur since the distance between the nickel silicide layer 24 and the dislocation place 20 is overly short. However, if it is considered to reduce the thickness of the nickel silicide layer, as shown by the nickel silicide layer 26 on the source/drain region 18, to increase the distance for avoiding piping, the nickel silicide layer 26 tends to be etched through during the etching process for formation of the contact plug 28 due to its small thickness, such that the contact plug 28 directly contacts the source/drain region 18, resulting in high contact resistance.

Therefore, there is still a need for a novel NMOS fabrication method for preventing the aforesaid problems.

SUMMARY OF THE INVENTION

One objective of the present invention is to provide a novel method of fabricating an NMOS transistor to overcome the aforesaid problems.

The method of fabricating an NMOS transistor according to the present invention includes steps as follows. First, a silicon substrate is provided. A gate structure is formed on the silicon substrate. The gate structure includes a gate insulation layer on the silicon substrate, a conductive layer on the gate insulation layer, and a spacer on a sidewall of the conductive layer. Next, a source/drain region is formed in the silicon substrate at each of two sides of the gate structure by introducing a dopant thereinto using the gate structure as a mask. Thereafter, an annealing process is performed on the silicon substrate. Subsequently, an epitaxial process is performed to form an epitaxial silicon layer covering the source/drain region and not covering the silicon substrate masked by the spacer. A nickel layer is formed to cover the epitaxial silicon layer. Thereafter, a rapid thermal process is performed to allow the nickel layer to react with the epitaxial silicon layer and the silicon substrate under the epitaxial silicon layer to form a nickel silicide layer.

In another aspect, the method has the similar features except that the conductive layer of the gate structure is a polysilicon layer, and a hard mask is formed on the polysilicon layer. After the epitaxial silicon layer is formed by the epitaxial process, the hard mask on the polysilicon layer is removed. Accordingly, the subsequently formed nickel layer covers both the epitaxial silicon layer and the polysilicon layer. After the RTP, the epitaxial silicon layer and the silicon substrate under the epitaxial silicon layer react with the nickel layer thereabove, and the polysilicon layer reacts with the nickel layer, to form a nickel silicide layer.

In further another aspect, the method of fabricating an NMOS transistor comprises steps as follows. A silicon substrate is provided. The silicon substrate includes a patterned gate insulation layer on the silicon substrate, a patterned conductive layer on the patterned gate insulation layer, a first spacer on a sidewall of the patterned conductive layer, a second spacer on the first spacer, a lightly doped drain region formed on and in the silicon substrate by introducing a first dopant thereinto using the patterned conductive layer or the first spacer as a mask, and a source/drain region formed in the lightly doped drain region and the silicon substrate thereunder by introducing a second dopant thereinto using the patterned conductive layer, the first spacer and the second spacer as a mask. An annealing process is performed on the silicon substrate. Thereafter, an epitaxial process is performed to form an epitaxial silicon layer covering the source/drain region and not covering the lightly doped drain region. Thereafter, a nickel layer is formed to cover the epitaxial silicon layer. Thereafter, a rapid thermal process is performed to allow the nickel layer to react with the epitaxial silicon layer and the silicon substrate under the epitaxial silicon layer to form a nickel silicide layer.

In the method of fabricating an NMOS transistor according to the present invention, an epitaxial silicon layer is formed before a salicide layer is formed, and the epitaxial silicon layer with the silicon substrate reacts with the nickel layer to form a nickel silicide layer. Therefore, the thickness of the integrated nickel silicide layer may be increased as desired to avoid being etched through during the etching step for forming a contact plug. Furthermore, the thickness of the nickel silicide layer is increased upward, not downward; therefore, the nickel silicide layer can keep a secure distance from dislocation often existing in the substrate (such as silicon substrate) to avoid piping effect.

These and other objectives of the present invention will no doubt become obvious to those of ordinary skill in the art after

DETAILED DESCRIPTION

Figure 1:
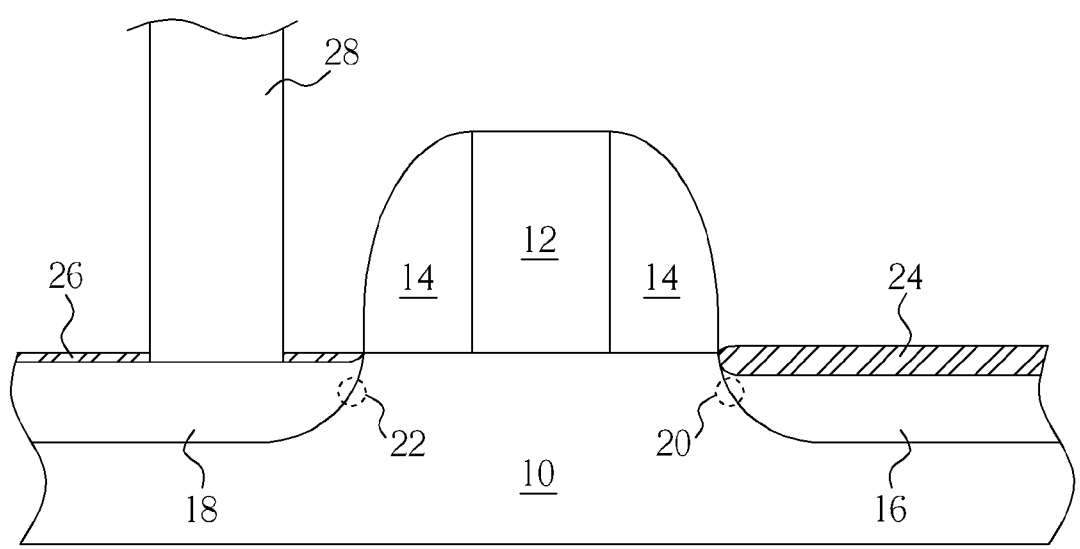
FIG. 1 is a schematic diagram illustrating problems encounter in conventional techniques.
Figure 2:
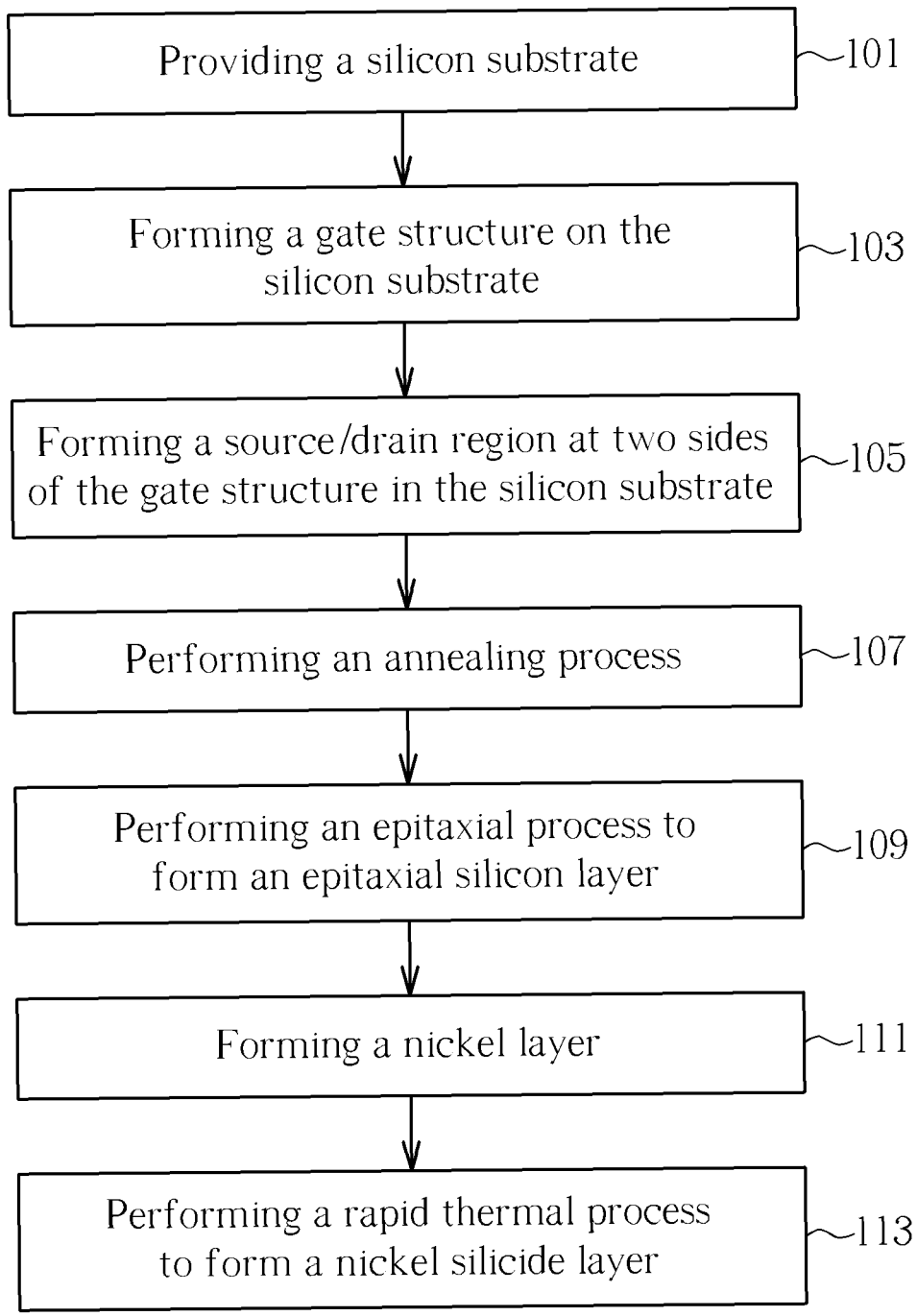
FIG. 2 is a flow chart illustrating the method of fabricating an NMOS transistor according to one embodiment of the present invention.
Figure 3:
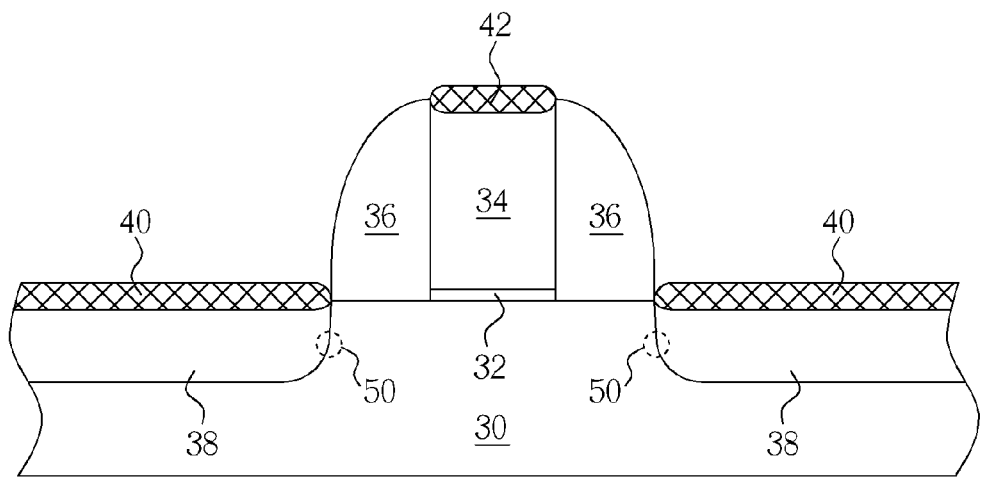
FIGS. 3-5 are schematic cross-sectional views illustrating NMOS transistors formed by some embodiments of the method of fabricating an NMOS transistor according to the present invention.

Referring to FIG. 2 showing a flow chart and FIG. 3 showing a schematic cross-sectional view of a resulting structure, an embodiment of the method of fabricating an NMOS transistor according to the present invention is described. First, a step 101 is performed to provide a silicon substrate 30. Next, a step 103 is performed to form a gate structure on the silicon substrate 30. The gate structure includes a gate insulation layer 32 on the silicon substrate 30, a conductive layer 34 on the gate insulation layer 32, and a spacer 36 on a sidewall of the conductive layer 34. Next, a step 105 is performed to form a source/drain region 38 in the silicon substrate 30 at two sides of the gate structure by introducing a dopant thereinto using the gate structure as a mask, respectively. Introduction of dopants may be accomplished by dopant implantation. The dopant may be for example arsenic. Thereafter, a step 107 is performed to carry out an annealing process on the silicon substrate 30. The temperature may be for example 1000 to 1300° C. for activating the dopants within the silicon substrate 30 and recovering the damaged lattices of the silicon substrate 30 damaged from dopant implantations. Thereafter, a step 109 is performed to carry out an epitaxial process to form an epitaxial silicon layer. The epitaxial silicon layer covers the source/drain region 38, but not covers the silicon substrate 30 masked by the spacer 36. A step 111 is performed to form a nickel layer covering the epitaxial silicon layer. Thereafter, a step 113 is performed to carry out a rapid thermal process to allow the nickel layer to react with the epitaxial silicon layer and the silicon substrate 30 under the epitaxial silicon layer to form a nickel silicide layer 40.

The nickel layer may be formed by sputtering process. The target may include a nickel metal or a nickel metal and a platinum metal (Pt), preferably that the platinum metal is 5% to 12% by weight based on the total weight of the target as 100% by weight. The added Pt may be removed by ammonia-hydrogen peroxide mixture cleaning process (APM) and hydrochloric acid-hydrogen peroxide mixture cleaning process (HPM).

After performing the epitaxial process to form the epitaxial silicon layer, a plasma surface treatment using for example $NH_3$ and $NF_3$ together (i.e. $NH_3+NF_3$) as a gas source for forming fluorine-containing plasma may be performed on the epitaxial silicon layer to allow the surface of the epitaxial silicon layer to absorb a layer of fluorine ions. The fluorine ion has a function to inhibit the piping effect. Thereafter, the nickel layer is performed to allow the nickel layer to cover the fluorine ion layer. Likewise, the nickel layer may include platinum metal.

The gate structure shown in FIG. 3 includes a conductive layer 34. The epitaxial silicon layer formed from the epitaxial process as described above may also cover the top surface of the gate structure. This portion of the epitaxial silicon layer also reacts with the nickel layer to form a nickel silicide layer 42.

The conductor layer of the gate structure is not limited to that shown in FIG. 3. In another embodiment, the top surface of the conductor layer may be at the same level as the top of the spacer 36, or below the top of the spacer 36 accordingly to form a recess. The epitaxial silicon layer may be formed within the recess to participate the following steps, such as forming a nickel layer thereon and subsequently forming a nickel silicide layer.

The thickness of such formed nickel silicide layer may be controlled to be as desired or meet the requirement for etching in the formation of the contact plug. Furthermore, the thickness of the nickel silicide layer grows upward, not downward; therefore, the nickel silicide layer can keep a secure distance from dislocation. A well-functioned transistor can be obtained even the silicon substrate 30 includes at least a dislocation 50 formed at a place in a depth of 200 to 300 angstroms from the surface of the silicon substrate 30 corresponding to the position of the edge of the gate structure.

Figure 4:
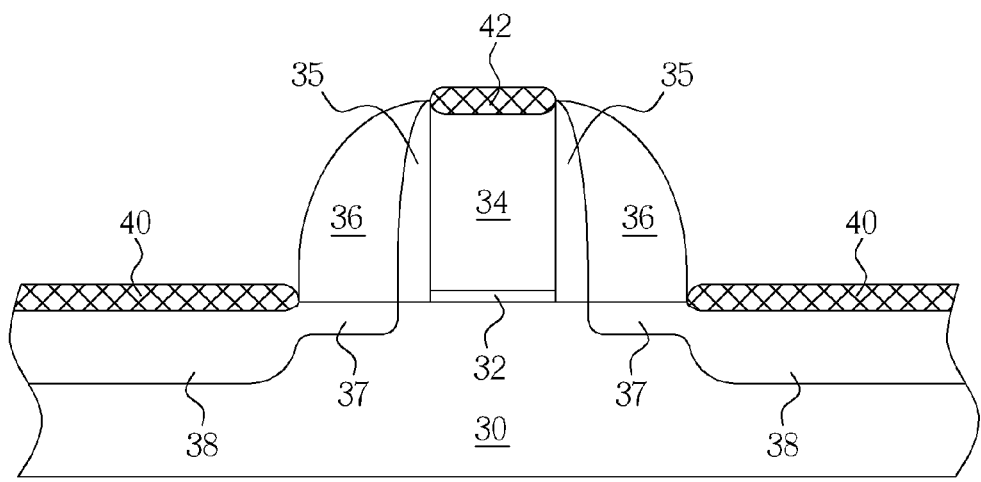

Furthermore, the gate structure of the NMOS transistor shown in FIG. 3 is indicated to have only a spacer 36; however, it is not limited to a single spacer. FIG. 4 shows the situation that the gate structure may further include a spacer 35 and a spacer 36, or more. Conventional spacer 35 may be used with the conductor layer 34 together to serve as a mask for introducing a dopant on and in the silicon substrate 30 to form a lightly doped drain region 37. Introduction of dopants may be accomplished by dopant implantation, to implant the dopant, such as arsenic, into the silicon substrate 30. Thereafter, a spacer 36 is formed on the spacer 35. A source/drain region 38 is formed at two sides of the gate structure in the silicon substrate 30 by introducing a dopant into the silicon substrate 30 using the gate structure as a mask, respectively. Thereafter, as described above, an annealing process is performed on the silicon substrate 30. Thereafter, an epitaxial process is performed to form an epitaxial silicon layer covering the source/drain region 38 and not covering the silicon substrate 30 masked by the spacer 36 (i.e. the lightly doped drain region 37). Thereafter, as described above, a nickel layer is formed to cover the epitaxial silicon layer. A rapid thermal process is performed to allow the nickel layer to react with the epitaxial silicon layer and the silicon substrate 30 under the epitaxial silicon layer to form a nickel silicide layer 40. Furthermore, as described above, a nickel silicide layer 42 may be also formed on the top surface of the conductive layer 34 of the gate structure. Furthermore, when the top surface of the conductive layer 34 is lower than the peripheral spacer to become a recess, the nickel silicide layer also may be formed within the recess.

Figure 5:
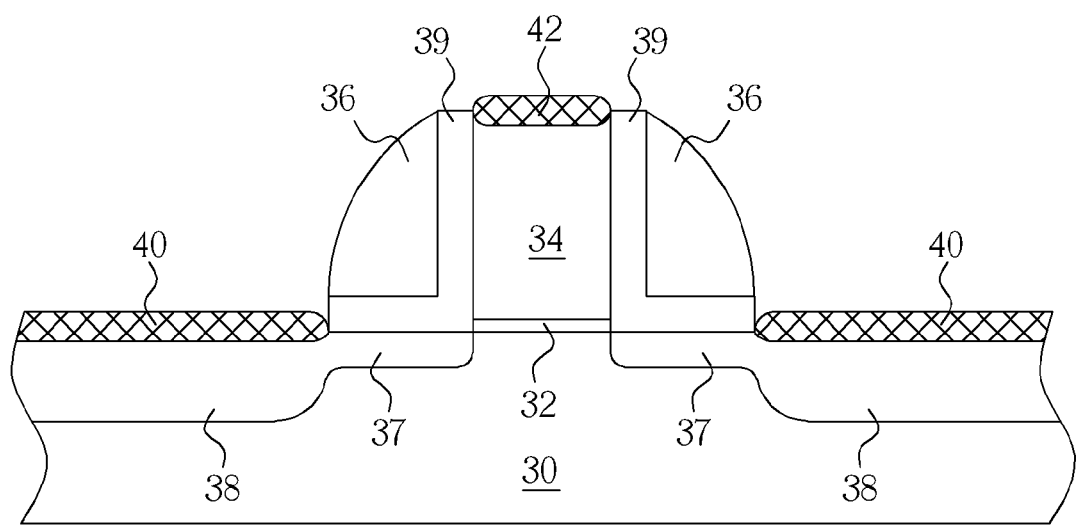

FIG. 5 shows a structure similar to FIG. 4, except that the spacer 35 is replaced with an L-shaped liner 39. The lightly doped drain region 37 is obtained by introducing a dopant on and in the silicon substrate 30 using the conductive layer 34 as a mask.

Figure 6:
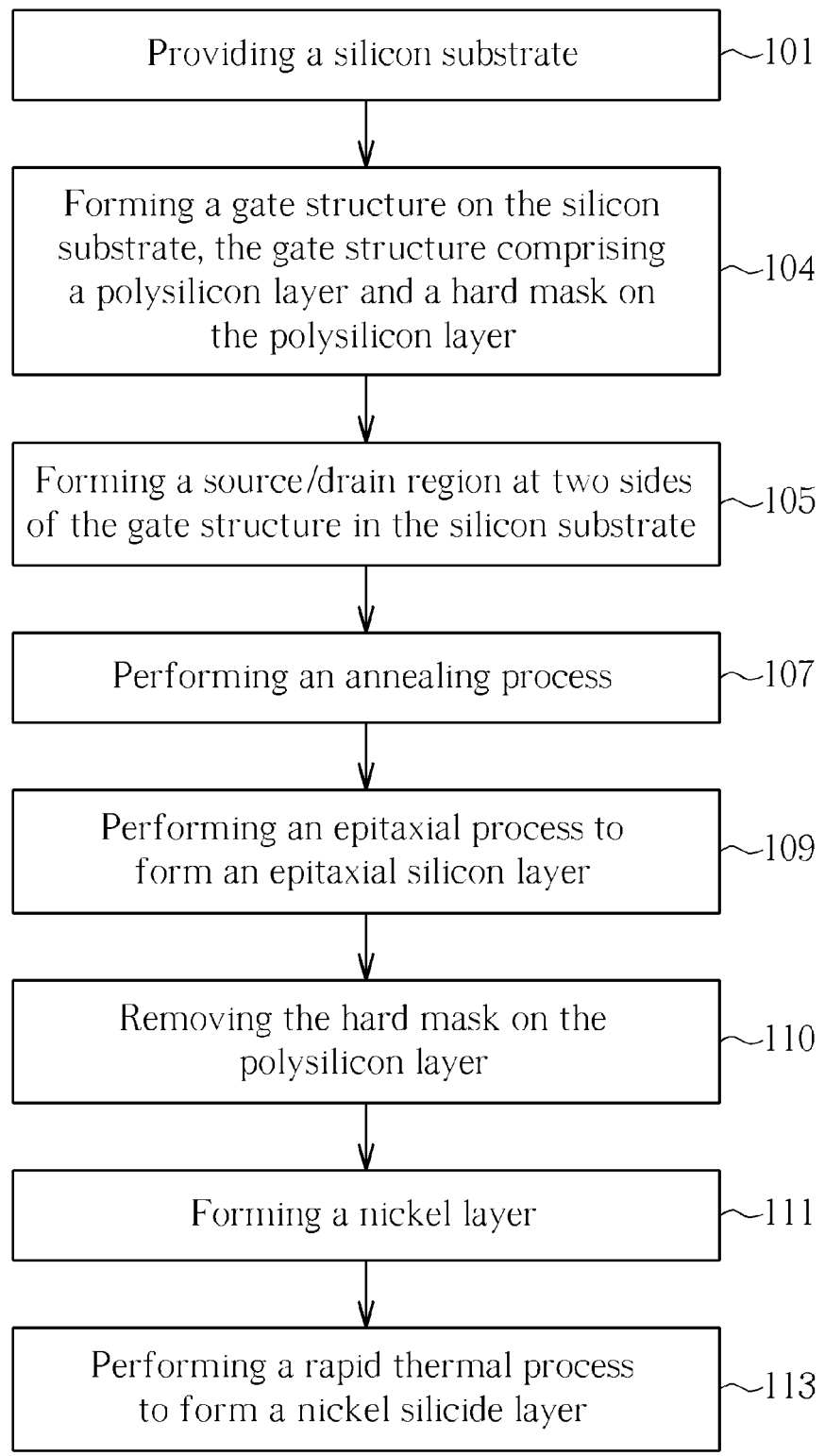
FIG. 6 is a flow chart illustrating the method of fabricating an NMOS transistor according to another embodiment of the present invention.
Figure 7:
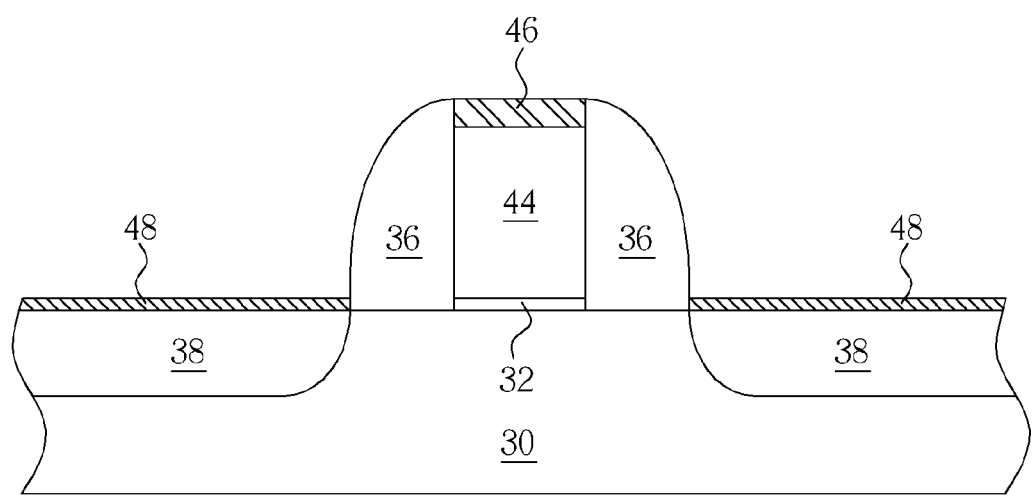
FIG. 7 is a schematic cross-sectional view illustrating a semi-finished NMOS transistor formed by an embodiment according to the flow chart shown in FIG. 6.

Referring to FIG. 6 showing a flow chart and FIG. 7 showing a schematic cross-sectional view of a semi-finished structure, another embodiment of the method of fabricating an NMOS transistor according to the present invention is described. First, a step 101 is performed to provide a silicon substrate 30. Next, a step 104 is performed to form a gate structure on the silicon substrate 30. The gate structure includes a gate insulation layer 32 on the silicon substrate 30, a polysilicon layer 44 on the gate insulation layer 32, a hard mask 46 on the polysilicon layer 44, and a spacer 36 on a sidewall of the polysilicon layer 44. Such gate structure is usually used in a 45 nm or beyond semiconductor process. The spacer 36 may be a single-layered spacer or a multilayered spacer. Next, a step 105 is performed to form a source/drain region 38 in the silicon substrate 30 at two sides of the gate structure by introducing a dopant thereinto using the gate structure as a mask, respectively. Thereafter, a step 107 is performed to carryout an annealing process on the silicon substrate 30. Thereafter, a step 109 is performed to carry out an epitaxial process to form an epitaxial silicon layer 48. The epitaxial silicon layer 48 covers the source/drain region 38, but not covers the silicon substrate 30 masked by the spacer 36. The resulting structure from this processing stage is shown in FIG. 7. Thereafter, a step 110 is performed to remove the hard mask 46 on the polysilicon layer 44. Thereafter, a step 111 is performed to form a nickel layer covering the epitaxial silicon layer 48 and the polysilicon layer 44, since no epitaxial silicon layer is formed on the polysilicon layer 44. Thereafter, a step 113 is performed to carry out a rapid thermal process to allow the nickel layer to react with the epitaxial silicon layer and the silicon substrate 30 under the epitaxial silicon layer to form a nickel silicide layer.

Those skilled in the art will readily observe that numerous modifications and alterations of the device and method may be made while retaining the teachings of the invention.

What is claimed is:

1. A method of fabricating an n-channel metal-oxide-semiconductor transistor, comprising:
   providing a silicon substrate;
   forming a gate structure on the silicon substrate, the gate structure comprising:
   a gate insulation layer on the silicon substrate,
   a conductive layer on the gate insulation layer, and
   a spacer on a sidewall of the conductive layer;
   forming a source/drain region at each of two sides of the gate structure in the silicon substrate by introducing a dopant thereinto using the gate structure as a mask;
   performing an annealing process on the silicon substrate;
   performing an epitaxial process to form an epitaxial silicon layer covering the source/drain region and not covering the silicon substrate masked by the spacer;
   performing a plasma surface treatment on the epitaxial silicon layer to allow the epitaxial silicon layer to absorb a layer of fluorine ions on a surface thereof;
   forming a nickel layer covering the layer of fluorine ions and the epitaxial silicon layer; and
   performing a rapid thermal process to allow the nickel layer to react with the epitaxial silicon layer and the silicon substrate under the epitaxial silicon layer to form a nickel silicide layer.

2. The method of claim 1, wherein forming the nickel layer is performed through carrying out a sputtering process using a target comprising a nickel metal and a platinum metal to form the nickel layer, wherein the platinum metal is 5% to 12% by weight based on the total weight of the target as 100% by weight.

3. The method of claim 1, wherein the epitaxial silicon layer formed from the epitaxial process further comprising an epitaxial silicon layer formed on a top surface of the conductive layer.

4. The method of claim 3, wherein the top surface of the conductive layer is below the height of the spacer to form a recess, and the epitaxial silicon layer formed on the top surface of the conductive layer is located within the recess.

5. A method of fabricating an n-channel metal-oxide-semiconductor transistor, comprising:
   providing a silicon substrate;
   forming a gate structure on the silicon substrate, the gate structure comprising:
   a gate insulation layer on the silicon substrate,
   a polysilicon layer on the gate insulation layer,
   a hard mask on the polysilicon layer, and
   a spacer on a sidewall of the polysilicon layer;
   forming a source/drain region at each of two sides of the gate structure in the silicon substrate by introducing a dopant thereinto using the gate structure as a mask;
   performing an annealing process on the silicon substrate;
   performing an epitaxial process to form an epitaxial silicon layer covering the source/drain region and not covering the silicon substrate masked by the gate structure;
   removing the hard mask on the polysilicon layer;
   performing a plasma surface treatment on the epitaxial silicon layer to allow the epitaxial silicon layer to absorb a layer of fluorine ions on a surface thereof;
   forming a nickel layer covering the layer of fluorine ions, the epitaxial silicon layer and the polysilicon layer; and
   performing a rapid thermal process to allow the epitaxial silicon layer and the silicon substrate under the epitaxial silicon layer to react with the nickel layer thereabove, and the polysilicon layer to react with the nickel layer to form a nickel silicide layer.

6. The method of claim 5, wherein forming the nickel layer is performed through carrying out a sputtering process using a target comprising a nickel metal and a platinum metal to form the nickel layer, wherein the platinum metal is 5% to 12% by weight based on the total weight of the target as 100% by weight.

7. A method of fabricating an n-channel metal-oxide-semiconductor transistor, comprising:
   providing a silicon substrate, the silicon substrate comprising:
   a patterned gate insulation layer on the silicon substrate,
   a patterned conductive layer on the patterned gate insulation layer,
   a first spacer on a sidewall of the patterned conductive layer,
   a second spacer on the first spacer,
   a lightly doped drain region formed on and in the silicon substrate by introducing a first dopant thereinto using the patterned conductive layer or the first spacer as a mask, and
   a source/drain region formed in the lightly doped drain region and the silicon substrate thereunder by introducing a second dopant thereinto using the patterned conductive layer, the first spacer and the second spacer as a mask;
   performing an annealing process on the silicon substrate;
   performing an epitaxial process to form an epitaxial silicon layer covering the source/drain region and not covering the silicon substrate masked by the spacer;
   performing a plasma surface treatment on the epitaxial silicon layer to allow the epitaxial silicon layer to absorb a layer of fluorine ions on a surface thereof;
   forming a nickel layer covering the layer of fluorine ions and the epitaxial silicon layer; and performing a rapid thermal process to allow the nickel layer to react with the epitaxial silicon layer and the silicon substrate under the epitaxial silicon layer to form a nickel silicide layer.

8. The method of claim 7, wherein forming the nickel layer is performed through carrying out a sputtering process using a target comprising a nickel metal and a platinum metal to form the nickel layer, wherein the platinum metal is 5% to 12% by weight based on the total weight of the target as 100% by weight.

9. The method of claim 7, wherein the epitaxial silicon layer formed from the epitaxial process further comprising an epitaxial silicon layer formed on a top surface of the patterned conductive layer.

10. The method of claim 9, wherein the top surface of the patterned conductive layer is below the height of the spacer to form a recess, and the epitaxial silicon layer formed on the top surface of the patterned conductive layer is located within the recess.

11. The method of claim 7, wherein, the first spacer comprises a liner, and the lightly doped drain region is formed on and in the silicon substrate by introducing the first dopant thereinto using the patterned conductive layer as the mask.

* * * * *